United States Patent
Wang et al.

(10) Patent No.: US 8,501,634 B2
(45) Date of Patent: Aug. 6, 2013

(54) METHOD FOR FABRICATING GATE STRUCTURE

(75) Inventors: Shao-Wei Wang, Taichung (TW);
Gin-Chen Huang, Taipei County (TW);
Tsuo-Wen Lu, Kaohsiung County (TW);
Chien-Liang Lin, Taoyuan County (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 46 days.

(21) Appl. No.: 13/045,291

(22) Filed: Mar. 10, 2011

(65) Prior Publication Data
US 2012/0228723 A1    Sep. 13, 2012

(51) Int. Cl.
*H01L 21/31* (2006.01)
(52) U.S. Cl.
USPC .............. 438/763; 438/287; 257/E21.409
(58) Field of Classification Search
USPC .............. 438/763, 287; 257/E21.409
See application file for complete search history.

(56) References Cited

U.S. PATENT DOCUMENTS

| | | | |
|---|---|---|---|
| 5,498,768 | A | 3/1996 | Nishitani et al. |
| 6,806,146 | B1 | 10/2004 | Brask et al. |
| 6,818,517 | B1 | 11/2004 | Maes |
| 6,841,484 | B2 | 1/2005 | Ying et al. |
| 7,012,027 | B2 | 3/2006 | Perng et al. |
| 7,030,430 | B2 | 4/2006 | Doczy et al. |
| 7,126,199 | B2 | 10/2006 | Doczy et al. |
| 7,160,767 | B2 | 1/2007 | Brask et al. |
| 7,220,635 | B2 | 5/2007 | Brask et al. |
| 7,381,608 | B2 | 6/2008 | Brask et al. |
| 7,488,656 | B2 | 2/2009 | Cartier et al. |
| 7,601,648 | B2 * | 10/2009 | Chua et al. ............... 438/763 |
| 2002/0130340 | A1 | 9/2002 | Ma et al. |
| 2002/0190302 | A1 | 12/2002 | Bojarczuk, Jr. et al. |
| 2004/0007561 | A1 | 1/2004 | Nallan et al. |
| 2005/0275035 | A1 | 12/2005 | Mathew et al. |
| 2008/0070395 | A1 | 3/2008 | Yen et al. |

* cited by examiner

*Primary Examiner* — Howard Weiss
*Assistant Examiner* — Steven Rao
(74) *Attorney, Agent, or Firm* — J.C. Patents

(57) ABSTRACT

A gate structure and a method for fabricating the same are described. A substrate is provided, and a gate dielectric layer is formed on the substrate. The formation of the gate dielectric layer includes depositing a silicon nitride layer on the substrate by simultaneously introducing a nitrogen-containing gas and a silicon-containing gas. A gate is formed on the gate dielectric layer, so as to form the gate structure.

17 Claims, 4 Drawing Sheets

METHOD FOR FABRICATING GATE STRUCTURE

BACKGROUND OF THE INVENTION

1. Field of the Invention

The present invention relates to a semiconductor process, and more particularly, to a gate structure and a method for fabricating the same.

2. Description of Related Art

Along with rapid progress of semiconductor technology, dimensions of semiconductor devices are reduced and the integrity thereof are promoted continuously to further advance the operating speed and performance of integrated circuits (ICs). As the demand for device integrity is raised, any changes in physical characteristics, such as electrical properties, have to be considered to avoid a great impact on the performance of the device.

Taking a metal-oxide-semiconductor (MOS) device as an example, with the continual miniaturization of the semiconductor devices, dimensions of a gate structure are also gradually reduced. Therefore, thickness of a gate dielectric layer also needs to be diminished, correspondingly. There are also more stringent demands for the quality of the gate dielectric layer, such as interface properties between the gate dielectric layer and the substrate. Generally, the gate dielectric layer is usually made of silicon oxide ($SiO_2$). Degradation of the electrical properties, such as occurrence of leakage current, frequently occurs when reducing the thickness of the gate dielectric layer adopting silicon oxide.

In order to reduce the thickness of the gate dielectric layer and ensure the electrical performance at the same time, a conventional method is to dope the gate dielectric layer of silicon oxide with high-density $N_2$ plasma, that is, so-called decoupled plasma nitridation (DPN), so that nitrogen-doped silicon oxide (i.e. SiON) is formed as the gate dielectric layer. The DPN-treated gate dielectric layer, however, encounters problems of relatively low nitrogen content contained in the gate dielectric layer. If the nitrogen content of the gate dielectric layer requires further enrichment, power of the $N_2$ plasma or processing time has to be raised in the DPN process. Augmentations of the plasma power or the processing time may cause nitrogen to be distributed even close to the substrate, thereby resulting in a great impact on channel performance of the MOS device.

SUMMARY OF THE INVENTION

Accordingly, the present invention is directed to a gate structure and a method for fabricating the same, in which a silicon nitride layer can be provided with the enhanced nitrogen content thereby improving the device performance.

A method for fabricating a gate structure of the present invention is described as follows. A substrate is provided, and a gate dielectric layer is formed on the substrate. The formation of the gate dielectric layer includes depositing a silicon nitride layer on the substrate by simultaneously introducing a nitrogen-containing gas and a silicon-containing gas. A gate is formed on the gate dielectric layer.

According to an embodiment of the present invention, the method of forming the gate dielectric layer includes forming a silicon oxide layer on the substrate before depositing the silicon nitride layer.

According to an embodiment of the present invention, the method further includes performing a soft annealing process before depositing the silicon nitride layer but after forming the silicon oxide layer. This soft annealing process is, for example, performed using the nitrogen-containing gas.

According to an embodiment of the present invention, the method further includes performing a soft annealing process after depositing the silicon nitride layer but before forming the gate. This soft annealing process is, for example, performed using the nitrogen-containing gas.

According to an embodiment of the present invention, the method further includes performing a thermal annealing process after depositing the silicon nitride layer but before forming the gate. The thermal annealing process may be performed at a temperature of 600° C. to 800° C.

According to an embodiment of the present invention, a process temperature for depositing the silicon nitride layer is within a range of 500° C. to 700° C.

According to an embodiment of the present invention, a volumetric flow rate ratio of the nitrogen-containing gas to the silicon-containing gas ranges between 10:1 and 40:1.

According to an embodiment of the present invention, the nitrogen-containing gas can be ammonia ($NH_3$).

According to an embodiment of the present invention, the silicon-containing gas can be hexachlorodisilane (HCD) or bis(tertiarybutylamino)silane (BTBAS).

According to an embodiment of the present invention, the silicon nitride layer is deposited by introducing the nitrogen-containing gas and the silicon-containing gas into a furnace.

According to an embodiment of the present invention, the silicon nitride layer is thicker than the silicon oxide layer.

According to an embodiment of the present invention, a nitrogen content of the silicon nitride layer is greater than 25 at %.

According to an embodiment of the present invention, the nitrogen content of the silicon nitride layer ranges between 30 at % and 50 at %.

According to an embodiment of the present invention, the nitrogen content of the silicon nitride layer ranges between 38 at % and 43 at %.

A gate structure of the present invention is also provided, including a gate dielectric layer and a gate. The gate dielectric layer disposed on a substrate includes a silicon nitride layer, and a nitrogen content thereof is greater than 25 at %. The gate is disposed on the gate dielectric layer.

According to an embodiment of the present invention, the nitrogen content of the silicon nitride layer ranges between 30 at % and 50 at %.

According to an embodiment of the present invention, the nitrogen content of the silicon nitride layer ranges between 38 at % and 43 at %.

According to an embodiment of the present invention, the silicon nitride layer has a thickness of 10 Å to 30 Å.

According to an embodiment of the present invention, the gate dielectric layer includes a silicon oxide layer disposed between the silicon nitride layer and the substrate. The silicon nitride layer is thicker than the silicon oxide layer.

According to an embodiment of the present invention, the silicon oxide layer has a thickness of 0 Å to 8 Å.

As mentioned above, the method for fabricating the gate structure according to the present invention includes depositing the silicon nitride layer on the silicon oxide layer by simultaneously introducing the nitrogen-containing gas and the silicon-containing gas. The silicon nitride layer of the gate dielectric layer can thus be provided with the lower EOT and the enhanced nitrogen content. Since the silicon nitride layer with the enriched nitrogen content is formed without the presence of plasma, the interface and electrical properties would not be influenced. As a result, the performance of the device can be efficiently enhanced.

Moreover, the gate structure according to the present invention includes the silicon nitride layer containing high nitrogen content, thereby obtaining a higher dielectric constant (K value) and keeping the desirable EOT at the same time.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
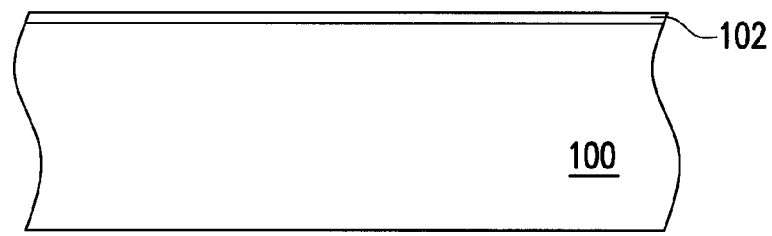
FIGS. 1A-1E depict, in a cross-sectional view, a method for fabricating a gate structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A-1E depict, in a cross-sectional view, a method for fabricating a gate structure according to an embodiment of the present invention. For illustration purposes, the following disclosure is described in terms of the gate structure of MOS, which is illustrated only as an exemplary example, but should not be adopted for limiting the scope of the present invention. The gate structure to be formed is not particularly limited by the present invention, whereas people skilled in the art should be able to embody the invention based on the illustration to obtain a gate dielectric layer with desirable properties. It is to be appreciated by those of ordinary skill in the art that other elements, such as a substrate, a gate and doped regions, can be arranged and fabricated based on techniques known to people skilled in the art, and are not limited to the descriptions in the following embodiments.

Referring to FIG. 1A, a substrate 100 is provided. The substrate 100 can be a semiconductor substrate, e.g. an N- or P-type silicon substrate, a group III-V semiconductor substrate and the like. A silicon oxide layer 102 is optionally formed on the substrate 100. The silicon oxide layer 102 can be a thermal oxide layer formed by rapid thermal oxidation (RTO) in a process chamber. The silicon oxide layer 102 is, for example, formed by in-situ steam generation (ISSG) oxidation process. In an embodiment, an oxygen-containing gas, e.g. $O_2$, is introduced into the process chamber, and a flow rate of the oxygen-containing gas supplied into the chamber can be within a range of about 1000 sccm to 5000 sccm. The process temperature for forming the silicon oxide layer 102 may be within a range of about 850° C. to 1050° C., and the process pressure may be within a range of about 1 Torr to 20 Torr. The silicon oxide layer 102 has a thickness of about 0 Å to 8 Å, preferably about 5 Å to 8 Å, possibly about 6 Å.

Figure 1B:
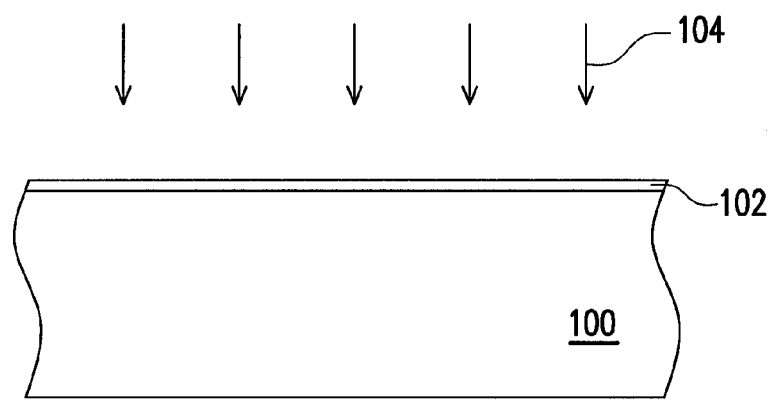

Referring to FIG. 1B, a soft annealing process 104 can be optionally performed, so as to modify the surface property of the silicon oxide layer 102. In an embodiment, the soft annealing process 104 is implemented by exposing the substrate 100 with the silicon oxide layer 102 formed thereon in nitrogen-containing gas ambiance, such that the upper surface of the silicon oxide layer 102 can be slightly nitridized thereby facilitating successive formation of a silicon nitride ($Si_3N_4$) layer. In other words, the soft annealing process 104 may function as a pre-treatment for the formation of the silicon nitride layer. The nitrogen-containing gas introduced during the soft annealing process 104 can be ammonia ($NH_3$) with a flow rate of about 1200 sccm to 5000 sccm. The duration of performing the soft annealing process 104, for example, ranges between about 1 minute and 10 minutes, preferably about 5 minutes. The soft annealing process 104 may be performed at a temperature between about 500° C. and 700° C., possibly about 580° C. The soft annealing process 104 may be performed under a pressure between about 0.2 Torr to 10 Torr.

Figure 1C:
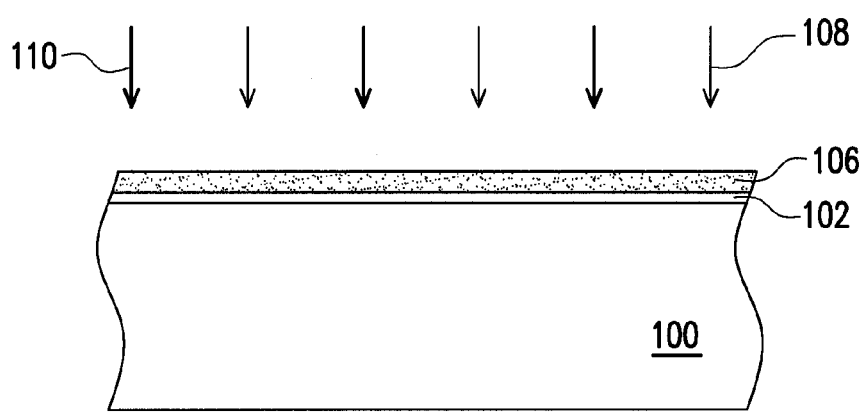

Referring to FIG. 1C, a silicon nitride layer 106 is then deposited on the silicon oxide layer 102 by simultaneously introducing a nitrogen-containing gas 108 and a silicon-containing gas 110. In an embodiment, the silicon nitride layer 106 can be deposited after introducing the nitrogen-containing gas 108 and the silicon-containing gas 110 as reactants in a furnace, and the deposition takes place in the furnace without the presence of plasma. A volumetric flow rate ratio of the nitrogen-containing gas 108 to the silicon-containing gas 110 ranges, for example, between about 10:1 and 40:1. In an embodiment, the nitrogen-containing gas 108 can be ammonia ($NH_3$), and a flow rate thereof supplied into the furnace is, for example, within a range with a flow rate of about 1200 sccm to 5000 sccm. In an embodiment, the silicon-containing gas 110 can be hexachlorodisilane (HCD) or bis(tertiarybutylamino)silane (BTBAS), and a flow rate thereof supplied into the furnace is, for example, within a range with a flow rate of about 60 sccm to 100 sccm. An inert gas, such as helium (He), argon (Ar) or nitrogen ($N_2$), may also be introduced into the furnace as a carrier gas or a diluting gas during the formation of the silicon nitride layer 106. The process temperature for forming the silicon nitride layer 106 may be within a range of about 500° C. to 700° C., possibly 580° C. The process pressure for forming the silicon nitride layer 106 may be within a range of about 0.2 Torr to 10 Torr. The silicon nitride layer 106 has a thickness of about 10 Å to 30 Å, possibly about 12 Å.

Figure 1D:
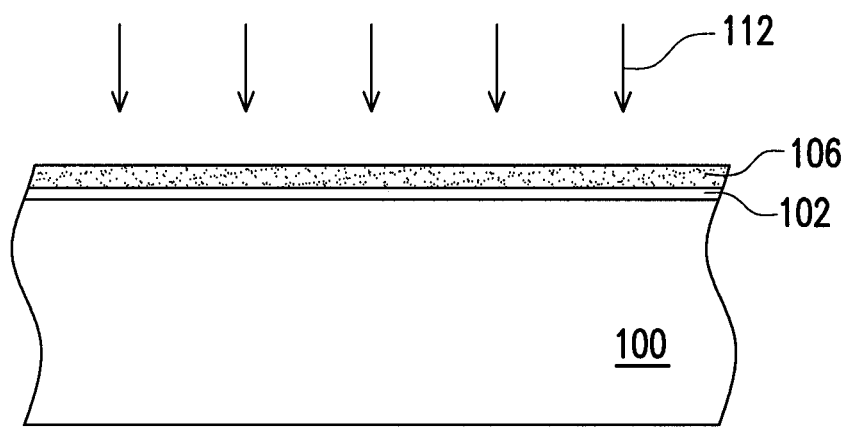

Referring to FIG. 1D, another soft annealing process 112 can be optionally performed after the formation of the silicon nitride layer 106. In an embodiment, the soft annealing process 112 is implemented by exposing the silicon nitride layer 106 in nitrogen-containing gas ambiance, so as to further enrich the nitrogen content contained in the silicon nitride layer 106. Therefore, the soft annealing process 112 may function as a post-treatment for the formation of the silicon nitride layer 106. The nitrogen-containing gas introduced during the soft annealing process 112 can be ammonia ($NH_3$) with a flow rate of about 1200 sccm to 5000 sccm. The duration of performing the soft annealing process 112, for example, ranges between about 1 minute and 10 minutes, preferably about 5 minutes. The soft annealing process 112 may be performed at a temperature between about 500° C.

and 700° C., possibly about 580° C. The soft annealing process 112 may be performed under a pressure between about 0.2 Torr to 10 Torr.

Alternatively, after the soft annealing process 112, a thermal annealing process can be optionally performed to the silicon nitride layer 106 and the silicon oxide layer 102 formed on the substrate 100, so as to repair damage caused by the foregoing processes thereby improving the qualities of the silicon nitride layer 106 and the silicon oxide layer 102. In an embodiment, the thermal annealing process may be implemented by heating the substrate 100 to a temperature of about 600° C. to 800° C., for example, in an annealing gas selected from the group consisting of $O_2$ and $N_2$. In addition, a flow rate of the annealing gas is usually about 1000 sccm to 10000 sccm, and the thermal annealing process may be performed under a pressure of about 1 Torr to 20 Torr. The duration of performing the thermal annealing process can range between about 0.5 minutes and 2 minutes.

It is noted that the soft annealing processes 104, 112 and the formation of the silicon nitride layer 106 can be carried out by introducing the same nitrogen-containing gas under substantially the same process conditions, while the difference mainly lies in the introduction of the silicon-containing gas 110 during the formation of the silicon nitride layer 106. That is to say, the nitrogen-containing gas 108 is, for example, continuously supplied without interruption during the soft annealing process 104, the formation of the silicon nitride layer 106 and the successive soft annealing process 112.

For example, after performing the soft annealing process 104 using the nitrogen-containing gas, the silicon nitride layer 106 is formed on the silicon oxide layer 102 by additionally introducing the silicon-containing gas 110 in the nitrogen-containing gas ambience of the soft annealing process 104. Once the silicon nitride layer 106 formed on the silicon oxide layer 102 reaches the pre-determined thickness, the silicon-containing gas 110 is turned off while the nitrogen-containing gas 108 is continuously introduced into the furnace, so as to conduct the soft annealing process 112 in situ. As the silicon-containing gas 110 is turned off, the deposition of the silicon nitride layer 106 may be stopped, but the soft annealing process 112 may advance the completeness of the reaction thereby raising the nitrogen content of the resultant silicon nitride layer 106. Accordingly, the resultant silicon nitride layer 106 can be provided with the enhanced nitrogen content greater than about 25 at % (atomic percentage), such as between about 30 at % and 50 at %, possibly between about 38 at % and 43 at %.

Figure 1E:
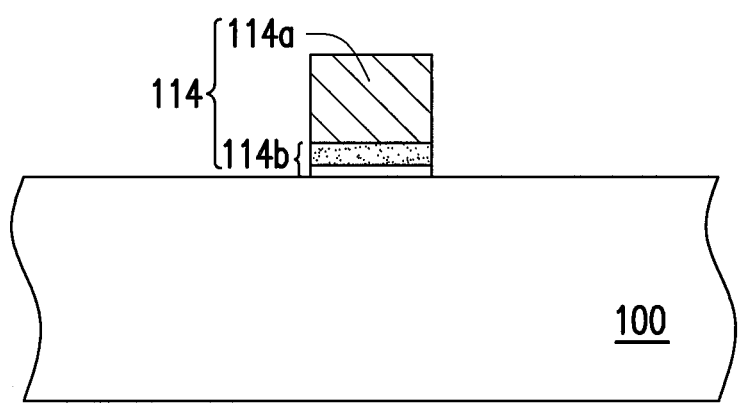

Referring to FIG. 1E, a conductive layer is formed on the silicon nitride layer 106. The conductive layer is made of polysilicon, for example. The conductive layer, the silicon nitride layer 106 and the silicon oxide layer are then patterned, so as to define a gate structure 114 on the substrate 100. In detail, the gate structure 114 includes a gate 114a and a gate dielectric layer 114b disposed between the gate 114a and the substrate 100. The gate 114a may be formed by etching the conductive layer, while the gate dielectric layer 114b may be formed by etching the stack of the silicon nitride layer 106 and the silicon oxide layer 102. Afterwards, doped regions (not shown) can be further formed in the substrate 100 at respective sides of the gate structure 114 and therefore serve as source and drain regions, so as to complete fabrication of a demanded semiconductor device. The arrangement and the formation of these doped regions or other components of the device are well appreciated by persons skilled in the art, and thus, the detailed descriptions thereof are not described herein.

It should be noticed that the gate dielectric layer 114b fabricated of the silicon nitride layer 106 and the silicon oxide layer 102 can have a low equivalent oxide thickness (EOT), such as between about 15 Å and 25 Å. In an embodiment, the EOT of the gate dielectric layer 114b can be well controlled to a desirable thickness by further thinning down, such as by etching back the silicon nitride layer 106 before forming the conductive layer thereon. Moreover, since the silicon nitride layer 106 contains relatively high nitrogen content, the gate dielectric layer 114b can be provided with a higher dielectric constant (K value) thereby reducing the occurrence of leakage current and preventing the degradation of the gate dielectric layer 114b. Consequently, the above-mentioned fabricating procedures can advantageously obtain the gate dielectric layer 114b with desirable EOT and electrical properties, and eventually improve the device performance.

A gate structure according to an embodiment of the invention is then illustrated with FIG. 1E. It should be noted that the details of the materials, effects and forming methods of each component in the gate structure have been described explicitly in the foregoing embodiment, and will be omitted hereinafter.

Referring to FIG. 1E again, the gate structure 114 includes the gate dielectric layer 114b and the gate 114a sequentially arranged on the substrate 100. That is to say, the gate dielectric layer 114b is disposed between the gate 114a and the substrate 100. The material of the gate 114a can be conductor, e.g. polysilicon. The gate dielectric layer 114b includes the silicon nitride layer 106 and optionally the silicon oxide layer 102, wherein the silicon oxide layer 102 is disposed between the silicon nitride layer 106 and the substrate 100. The silicon nitride layer 106 is thicker than the silicon oxide layer 102. In an embodiment, the silicon nitride layer 106 has a thickness of about 10 Å to 30 Å, possibly about 12 Å, while the silicon oxide layer 102 has a thickness of about 0 Å to 8 Å, preferably about 5 Å to 8 Å, possibly about 6 Å. Accordingly, the equivalent oxide thickness (EOT) of the gate dielectric layer 114b may range between about 15 Å and 25 Å. It is also noticed that the nitrogen content of the silicon nitride layer 106 is greater than about 25 at %, such as between about 30 at % and 50 at %, possibly between about 38 at % and 43 at %.

To substantiate the advantageous efficacy of the gate structure and the method for fabricating the same in this invention, distribution profiles of elemental composition contained in the gate dielectric layer on the substrate according to several examples are measured and described hereinafter. It should be appreciated that the following experimental data are provided merely to illustrate variations in the content of each element at different depth from the upper surface of the gate dielectric layer, but are not intended to limit the scope of the present invention.

Comparative Example

Figure 2:
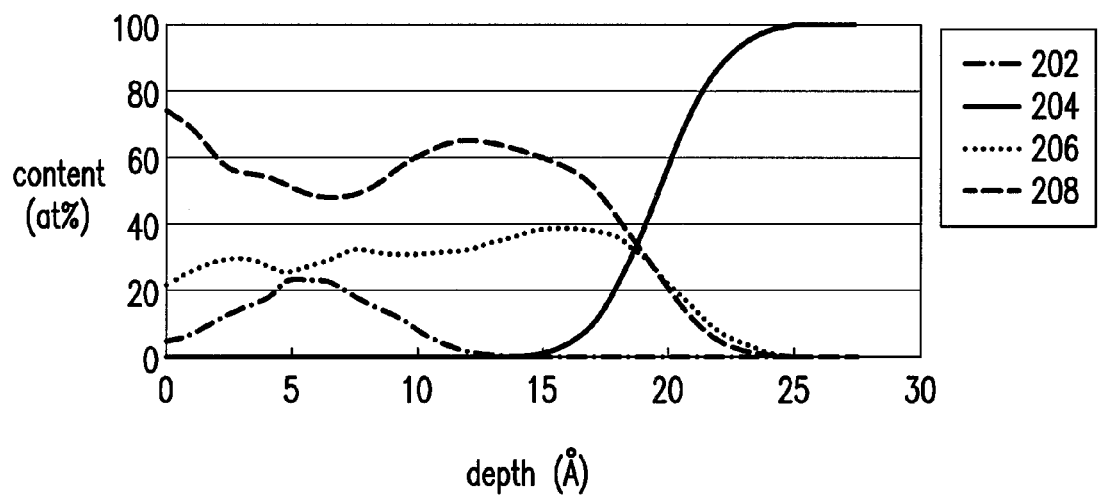
FIG. 2 schematically illustrates distribution profiles of the elements as the depth from the upper surface of the gate dielectric layer deepened according to a conventional fabrication.

FIG. 2 schematically illustrates distribution profiles of the elements as the depth from the upper surface of the gate dielectric layer deepened according to a conventional fabrication. As for the fabrication of the conventional gate structure, a silicon oxide layer of about 17 Å is formed on a silicon substrate, and $N_2$ plasma treatment, i.e. decoupled plasma nitridation (DPN), is then conducted to the silicon oxide layer. The $N_2$ plasma treatment is conducted at RF power of about 2000 W. The resultant nitrogen-doped silicon oxide layer of about 23 Å is formed as a gate dielectric layer of the conventional gate structure, and is analyzed by angle-resolved X-ray photoelectron spectroscopy (ARXPS). It is noted that the data measured by ARXPS is then calculated and quantified in terms of atomic percent (at %) values, and the results are shown in FIG. 2.

Referring to FIG. 2, curve 202 stands for a nitride signal, which can infer the silicon nitride layer. Curve 204 stands for a silicon signal, which can infer the silicon substrate. Curve 206 stands for an oxide signal, which can infer the oxide contained in the silicon nitride layer. Curve 208 stands for another oxide signal, which can infer the silicon oxide layer. It can be observed that the conventional gate dielectric layer formed by DPN has the highest nitrogen content of about 21 at %, as indicated by the distribution profile of curve 202.

Examples 1-2

Figure 3:
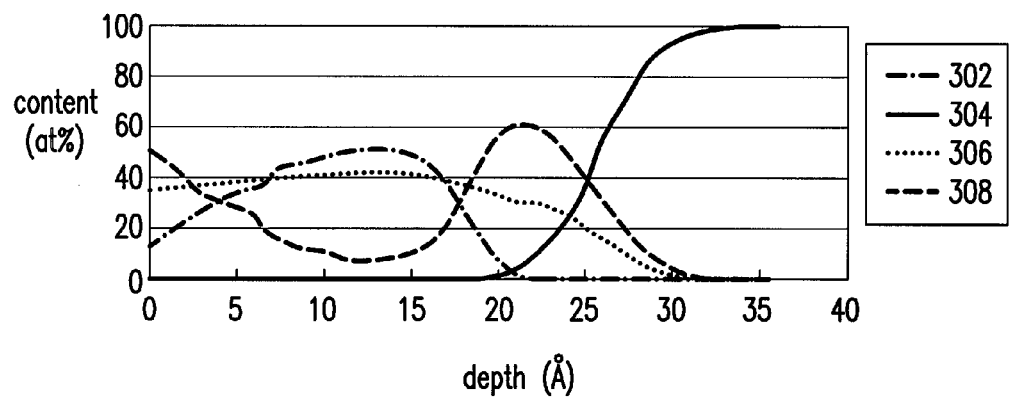
FIG. 3 schematically illustrates distribution profiles of the elements as the depth from the upper surface of the gate dielectric layer deepened according to an example of the invention.
Figure 4:
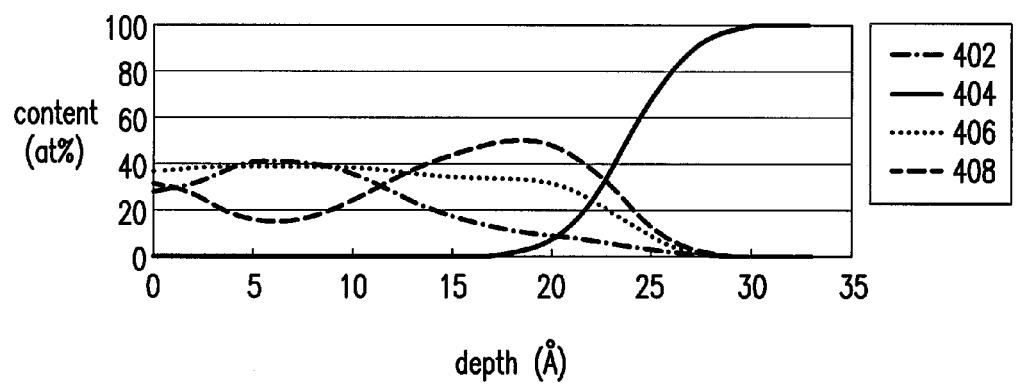
FIG. 4 schematically illustrates distribution profiles of the elements as the depth from the upper surface of the gate dielectric layer deepened according to another example of the invention.

FIG. 3 schematically illustrates distribution profiles of the elements as the depth from the upper surface of the gate dielectric layer deepened according to an example of the invention. FIG. 4 schematically illustrates distribution profiles of the elements as the depth from the upper surface of the gate dielectric layer deepened according to another example of the invention. In Examples 1-2, a gate dielectric layer includes a silicon oxide layer of about 6 Å and a silicon nitride layer of about 20 Å, wherein the silicon nitride layer deposited on the silicon oxide layer is fabricated by introducing ammonia ($NH_3$) and hexachlorodisilane (HCD) as reactants into the furnace as illustrated in the foregoing embodiments. Example 1 represents the gate dielectric layer fabricated without performing the thermal annealing process after the formation of the silicon nitride layer, while Example 2 represents the gate dielectric layer fabricated with performing the thermal annealing process at 800° C. after the formation of the silicon nitride layer. The resultant gate dielectric layers in Examples 1-2 are then analyzed by ARXPS, and the data measured by ARXPS is quantified in terms of atomic percent (at %) values as shown in FIGS. 3-4.

Likewise, referring to FIGS. 3-4, curves 302 and 402 stand for nitride signals, each of which can infer the silicon nitride layer. Curve 304 and 404 stand for silicon signals, each of which can infer the silicon substrate. Curve 306 and 406 stand for oxide signals, each of which can infer the oxide contained in the silicon nitride layer. Curve 308 and 408 stand for oxide signals, each of which can infer the silicon oxide layer. It can be observed that the gate dielectric layer in Example 1 has the highest nitrogen content of about 50 at %, as indicated by the distribution profile of curve 302, while the gate dielectric layer in Example 2 has the highest nitrogen content of about 40 at %, as indicated by the distribution profile of curve 402. In addition, the nitrogen profiles of Examples 1-2 (i.e. curves 302 and 402) is still distributed away from the silicon substrate (i.e. at the depth where the highest of curves 304 and 404 occur) even if the nitrogen content is enriched, and thereby the device performance would not be impacted.

Moreover, the equivalent oxide thickness (EOT) of the gate dielectric layer and leakage current density of the gate structure (Jg) are listed in Table 1 respectively according to Comparative Example and Examples 1-2.

TABLE 1

|  | Comparative Example | Example 1 | Example 2 |
|---|---|---|---|
| EOT (Å) | 18 | 18.1 | 18.5 |
| Jg (A/cm$^2$) | 6 | 2 | 0.6 |

As shown in Table 1, it is obvious Jg measured in Examples 1-2 is much lower than that in Comparative Example, indicating the leakage current can be effectively inhibited by this invention. A lower Jg may be expected after further thinning down the gate dielectric layer fabricated accordingly to this invention. Overall, as compared with the conventional fabrication (i.e. DPN), the nitrogen content of the gate dielectric layer can be enhanced greatly by the fabrication of this invention no matter whether the thermal annealing process is performed or not. Based on the above results, the dielectric constant of the gate dielectric layer proposed in this invention can be increased without damaging the interface properties between the gate dielectric layer and the substrate, so that the improvement of the device performance can be achieved.

In view of the above, the gate structure and the method for fabricating the same according to an embodiment of the present invention is implemented by simultaneously introducing the nitrogen-containing gas and the silicon-containing gas into the furnace to deposit the silicon nitride layer on the silicon oxide layer, serving as the gate dielectric layer. The silicon nitride layer of the gate dielectric layer can thus be provided with the lower EOT and also with the enhanced nitrogen content. Moreover, the fabrication of the silicon nitride layer is carried out at a relatively low process temperature and without the presence of plasma, thereby preventing the silicon oxide layer and the substrate from damage. Hence, the desirable EOT and electrical properties are preserved in the structure and the method proposed in the present invention, and the device performance can thus be improved effectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a gate structure, comprising:
   providing a substrate;
   forming a gate dielectric layer on the substrate, comprising:
   forming a silicon oxide layer on the substrate;
   depositing a silicon nitride layer on the substrate by simultaneously introducing a nitrogen-containing gas and a silicon-containing gas into a furnace to deposit the silicon nitride layer on the silicon oxide layer without the presence of plasma; and
   wherein the step of depositing the silicon nitride layer on the substrate is performed without the presence of plasma
   forming a gate on the gate dielectric layer.

2. The method according to claim 1, wherein the silicon nitride layer is thicker than the silicon oxide layer.

3. The method according to claim 1, further comprising performing a soft annealing process before depositing the silicon nitride layer but after forming the silicon oxide layer.

4. The method according to claim 3, wherein the soft annealing process is performed using the nitrogen-containing gas.

5. The method according to claim 1, further comprising performing a soft annealing process after depositing the silicon nitride layer but before forming the gate.

6. The method according to claim 5, wherein the soft annealing process is performed using the nitrogen-containing gas.

7. The method according to claim 1, further comprising performing a thermal annealing process after depositing the silicon nitride layer but before forming the gate.

8. The method according to claim 7, wherein the thermal annealing process is performed at a temperature of 600° C. to 800° C.

9. The method according to claim 1, wherein a process temperature for depositing the silicon nitride layer is within a range of 500° C. to 700° C.

10. The method according to claim 1, wherein a volumetric flow rate ratio of the nitrogen-containing gas to the silicon-containing gas ranges between 10:1 and 40:1.

11. The method according to claim 1, wherein the nitrogen-containing gas comprises ammonia ($NH_3$).

12. The method according to claim 1, wherein the silicon-containing gas comprises hexachlorodisilane (HCD) or bis(tertiarybutylamino)silane (BTBAS).

13. The method according to claim 1, wherein a nitrogen content of the silicon nitride layer is greater than 25 at %.

14. The method according to claim 1, wherein a nitrogen content of the silicon nitride layer ranges between 30 at % and 50 at %.

15. The method according to claim 1, wherein a nitrogen content of the silicon nitride layer ranges between 38 at % and 43 at %.

16. The method according to claim 7, further comprising performing a soft annealing process, wherein the step of depositing the silicon nitride layer, the soft annealing process, the thermal annealing process and the step of forming the gate are performed in sequence.

17. The method according to claim 3, wherein the soft annealing process is performed in-situ in the furnace.

* * * * *